(12) United States Patent
Chan et al.

(10) Patent No.: US 6,278,311 B1
(45) Date of Patent: Aug. 21, 2001

(54) METHOD FOR MINIMIZING INSTANTANEOUS CURRENTS WHEN DRIVING BUS SIGNALS

(75) Inventors: Albert Chan, Palo Alto; Ju Shen, Saratoga; Cyrus Y. Tsui, Los Altos Hills; Rafael C. Camarota, Sunnyvale, all of CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 09/440,207

(22) Filed: Nov. 15, 1999

Related U.S. Application Data

(62) Division of application No. 09/083,205, filed on May 21, 1998.

(51) Int. Cl.[7] .................................................. H03H 11/26
(52) U.S. Cl. ............................................. 327/269; 327/395
(58) Field of Search .................................. 327/269, 270, 327/392, 393, 394, 395, 396, 400, 402; 326/37, 49, 50

(56) References Cited

U.S. PATENT DOCUMENTS

| | | | |
|---|---|---|---|
| 4,626,716 | * 12/1986 | Miki | 307/590 |
| 4,758,746 | 7/1988 | Birkner et al. | 326/40 |
| 4,825,109 | * 4/1989 | Reynolds | 307/601 |
| 4,967,110 | * 10/1990 | Matsuura | 307/592 |
| 5,121,006 | 6/1992 | Pederson | 326/38 |
| 5,220,215 | 6/1993 | Douglass et al. | 326/39 |
| 5,239,213 | 8/1993 | Norman et al. | 326/38 |
| 5,300,830 | 4/1994 | Hawes | 326/41 |
| 5,350,954 | 9/1994 | Patel | 326/39 |
| 5,489,858 | 2/1996 | Pierce et al. | 326/56 |
| 5,568,081 | 10/1996 | Lui et al. | 327/380 |
| 5,646,546 | 7/1997 | Bertolet et al. | 326/39 |
| 5,705,942 | * 1/1998 | Ashuri | 326/93 |
| 5,821,773 | 10/1998 | Norman et al. | 326/39 |
| 5,841,296 | 11/1998 | Churcher et al. | 326/49 |
| 5,923,199 | * 7/1999 | Kikuchi | 327/269 |
| 5,963,048 | 10/1999 | Harrison et al. | 326/39 |
| 5,969,539 | 10/1999 | Veytsman et al. | 326/39 |
| 6,011,730 | 1/2000 | Sample et al. | 365/189.05 |
| 6,020,757 | 2/2000 | Jenkins, IV | 326/39 |
| 6,034,541 | 3/2000 | Kopec, Jr. et al. | 326/39 |
| 6,034,548 | 3/2000 | Churcher et al. | 326/49 |

\* cited by examiner

*Primary Examiner*—Jung Ho Kim
(74) *Attorney, Agent, or Firm*—Skjerven Morrill MacPherson LLP; Edward C. Kwok; Daniel P. Stewart

(57) ABSTRACT

A method for minimizing instantaneous currents ina signal bus is disclosed. The method involves providing a programmable delay element in each of the signal buffers driving the signal on the bus. The programmable delay element in each signal buffer is selectable enabled to include a predetermined time delay. The method involves programming the delay elements in a selected group of the signal buffers t includde the predetermined time delay, so that the selected group of signal buffers each generate an output signal switching after the predetermined delay relative to the switching of output signals generated by other signal buffers.

7 Claims, 7 Drawing Sheets

METHOD FOR MINIMIZING INSTANTANEOUS CURRENTS WHEN DRIVING BUS SIGNALS

CROSS REFERENCE TO RELATED APPLICATION

This application is a divisional of U.S. patent application Ser. No. 09/083,205, filed May 21, 1998, entitled "Programmable Logic Device".

TECHNICAL FIELD OF THE INVENTION

The present invention relates to programmable logic circuits, and in particular, relates to the design of an improved field programmable logic device.

BACKGROUND OF THE INVENTION

One type of high density programmable logic devices ("PLDs") is the in-system programmable Large Scale Integration (ispLSI) family of devices from Lattice Semiconductor Corporation, Hillsboro, Oreg. An ispLSI device is reprogrammable in its application environment without being removed from the environment.

High density programmable logic devices, such as the ispLSI devices, are often referred to as "complex PLDs." In a complex PLD, programmable logic functions are configured by programming a number of programmable logic blocks. Each programmable logic block typically includes a set of cells, in which each cell performs a single logic function and generates an output signal based on that logic function.

The number of logic functions that can be performed by a programmable logic device is typically limited by the number of cells in the device. Furthermore, the assignment of logic functions to the respective cells prior to programming the device can be a difficult task due to the limited availability of signal routing among cells within the programmable logic device. Generating an viable interconnect solution can be especially difficult when the number of logic functions to be performed is equal to or close to the number of cells, so that the programmable logic device is at or near capacity. Moreover, when the number of logic functions to be performed is greater than the number of cells in the device, the device is simply not capable of performing the desired functions.

SUMMARY OF THE INVENTION

Thus, a need has arisen for a programmable logic device that addresses the disadvantages and deficiencies of the prior art. In particular, the need has arisen for a programmable logic device with the capability to perform more than one logic function within each cell.

Accordingly, an improved programmable logic device is disclosed. In one embodiment, the programmable logic device includes a set of I/O cells, a set of logic blocks, and a routing pool that provides connections among the logic blocks and the I/O cells. At least one of the logic blocks includes a programmable logic array with a plurality of product term output lines. The programmable logic array generates a product term output signal on each product term output line. The logic block also includes a first product term summing circuit with a plurality of input terminals. At least one of the input terminals is coupled to at least one of the product term output lines. The first product term summing circuit generates an output signal at an output terminal in response to at least one product term output signal received at at least one respective input terminal. The logic block further includes a second product term summing circuit with a plurality of input terminals. At least one of the input terminals is coupled to at least one of the product term output lines. The second product term summing circuit generates an output signal at an output terminal in response to at least one product term output signal received at at least one respective input terminal. The logic block further includes first and second output lines and a first programmable switching device that programmably couples the first output line to the output terminal of a selected one of the first and second product term summing circuits. The logic block further includes a second programmable switching device that programmably couples the second output line to the output terminal of a selected one of the first and second product term summing circuits.

A technical advantage of the present invention is that each logic block is capable of performing two logic functions in each macrocell. Another technical advantage of the present invention is that generating an interconnect solution to program the programmable logic device is made simpler by the increased functional capacity of the device. Yet another technical advantage is that programmable output delays are provided to reduce output signal noise and increase the switching speed of time-critical output signals.

BRIEF DESCRIPTION OF THE DRAWINGS

For a more complete understanding of the present invention and for further features and advantages, reference is now made to the following description taken in conjunction with the accompanying drawings, in which.

DETAILED DESCRIPTION OF THE INVENTION

The preferred embodiments of the present invention and their advantages are best understood by referring to FIGS. 1 through 6 of the drawings. Like numerals are used for like and corresponding parts of the various drawings.

Figure 1A:
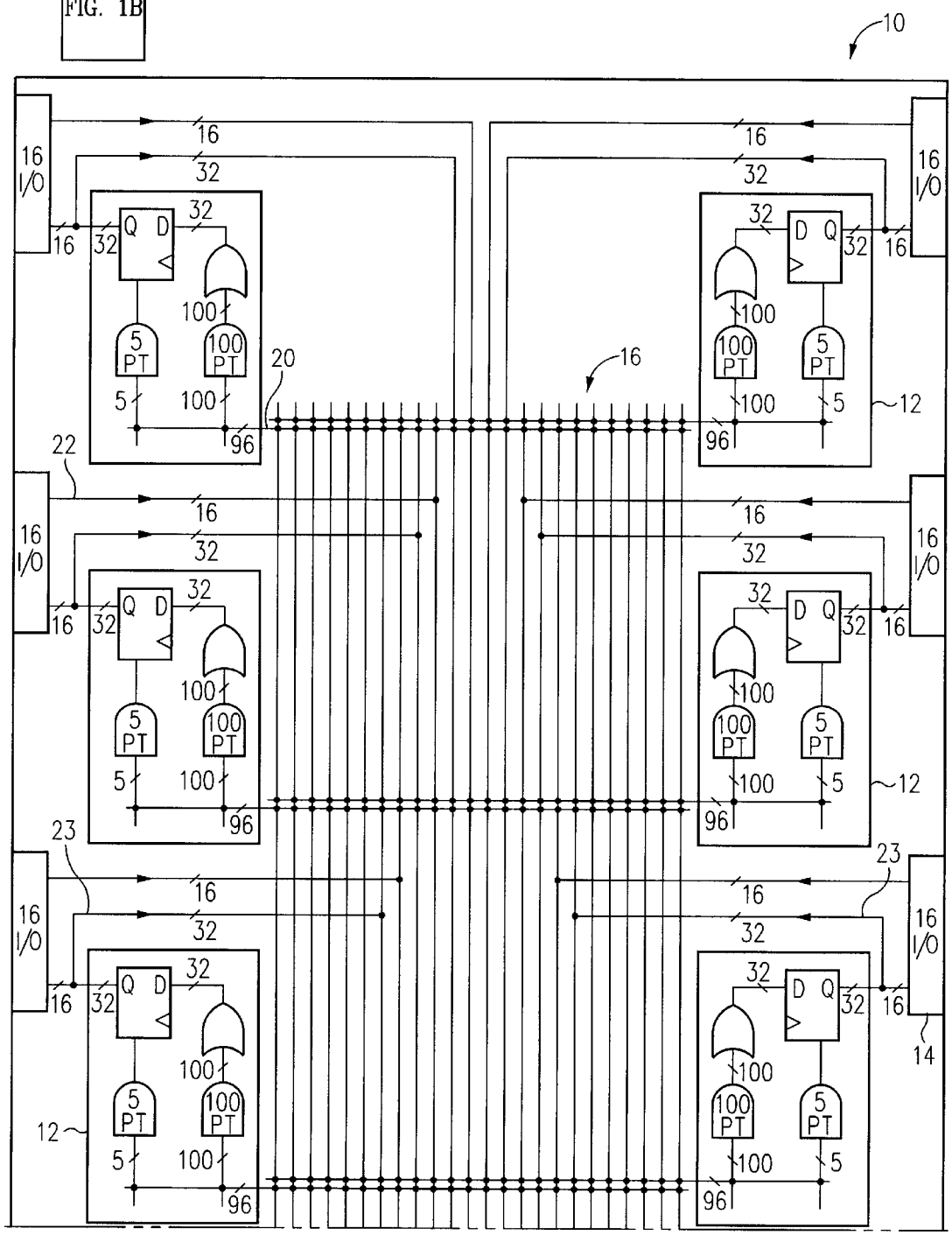
FIGS. 1A and 1B are block diagram of a programmable logic device constructed in accordance with the present invention.
Figure 1B:
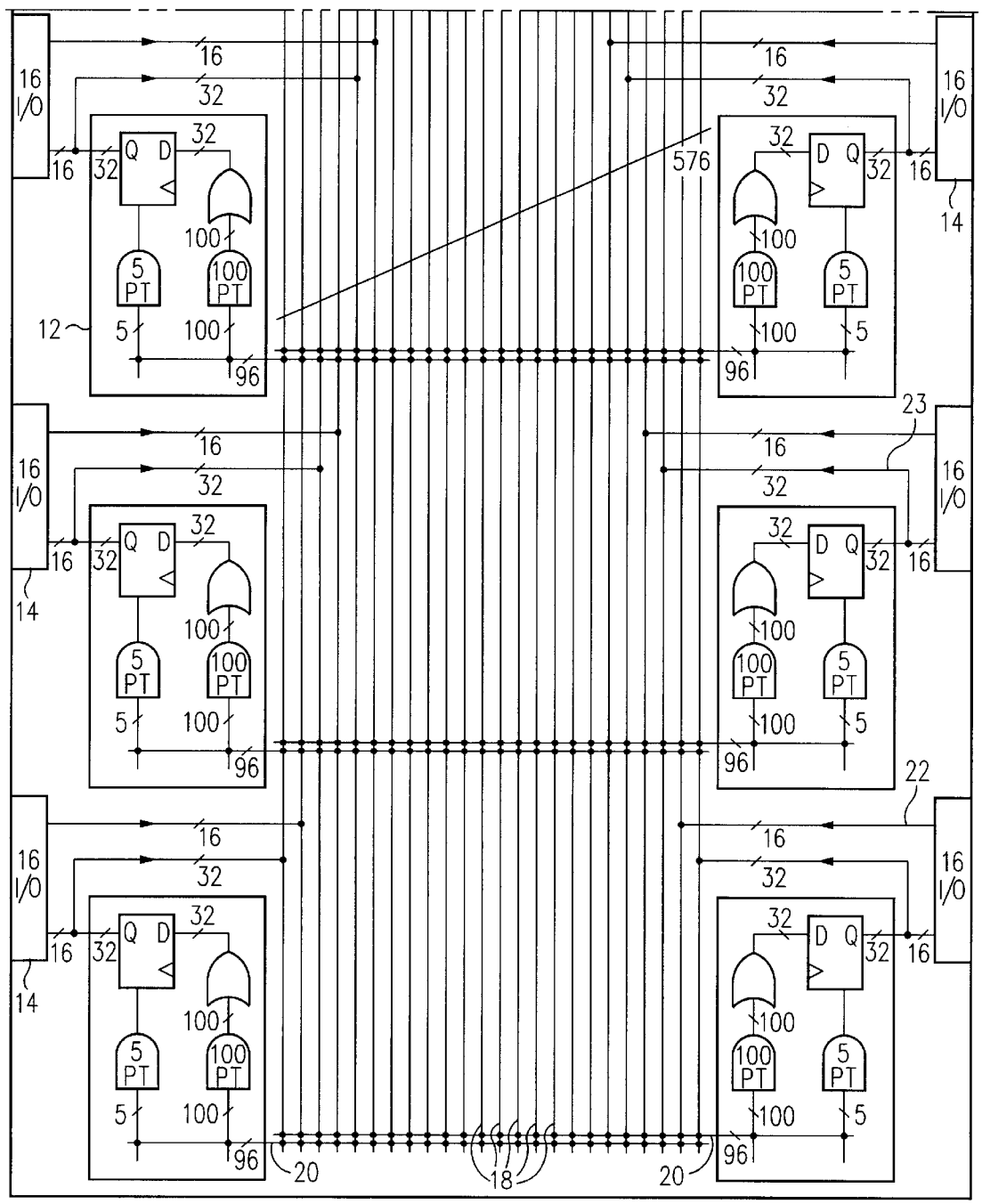

Referring to FIG. 1, a programmable logic device 10 constructed in accordance with the present invention is shown. Programmable logic device 10 includes twelve generic logic blocks 12. Each generic logic block 12 includes a set of logic gates which may be programmed to perform logic functions on input signals. Generic logic blocks 12 will be described more fully below.

Generic logic blocks 12 receive input signals and transmit output signals via I/O cells 14. I/O cells 14 are coupled to I/O pins (not shown) on programmable logic device 10. The type of I/O pins used for programmable logic device 10 depends on the type of packaging used for programmable logic device 10. For example, in a surface mount package, the I/O pins may be leads extending from a lead frame, while in a ball grid array package, the pins would be solder connections on the bottom surface of the package. In this example, a ball grid array package is used to achieve the desired I/O pin density. Other standard packaging and pinout techniques may also be used.

A global routing pool 16 provides programmable communication lines for communication among generic logic blocks 12 and I/O cells 14. Global routing pool 16 includes 576 bus lines 18, each of which carries either a signal conducted from an I/O cell 14 by a line 22 or a signal conducted from a generic logic block 12 by a line 23. Some bus lines 18 may be programmably connected to input lines 20 of generic logic blocks 12.

An EEPROM cell array (not shown) is used to provide programmable interconnections and signal routing in global routing pool 16. The EEPROM cell array also provides various other programmable interconnections throughout programmable logic device 10, as will be described more fully below.

In this example, global routing pool 16 is not fully populated. Thus, not every bus line 18 has a programmable interconnection to every input line 20 of every generic logic block 12. This reduces the number of EEPROM cells required for global routing pool 16, and also increases the switching speed of bus lines 18 in global routing pool 16.

Programmable logic device 10 may be used to perform logic operations on binary logic input signals to produce output signals. For example, programmable logic device may be programmed to solve the following simple equation:

$$X = A \otimes B \otimes C \oplus A \otimes B \otimes D \oplus D \otimes E \qquad (1)$$

In equation (1), A, B, C, D and E are input signals received by programmable logic device 10 and X is an output signal produced by programmable logic device 10. The symbol $\oplus$ denotes an OR operation and $\otimes$ denotes an AND operation. Thus, "$A \otimes B \otimes C$" is a combination of the A, B and C input signals in an AND operation. This type of AND grouping will be referred to herein as a product term.

Generic Logic Block Overview

Figure 2A:
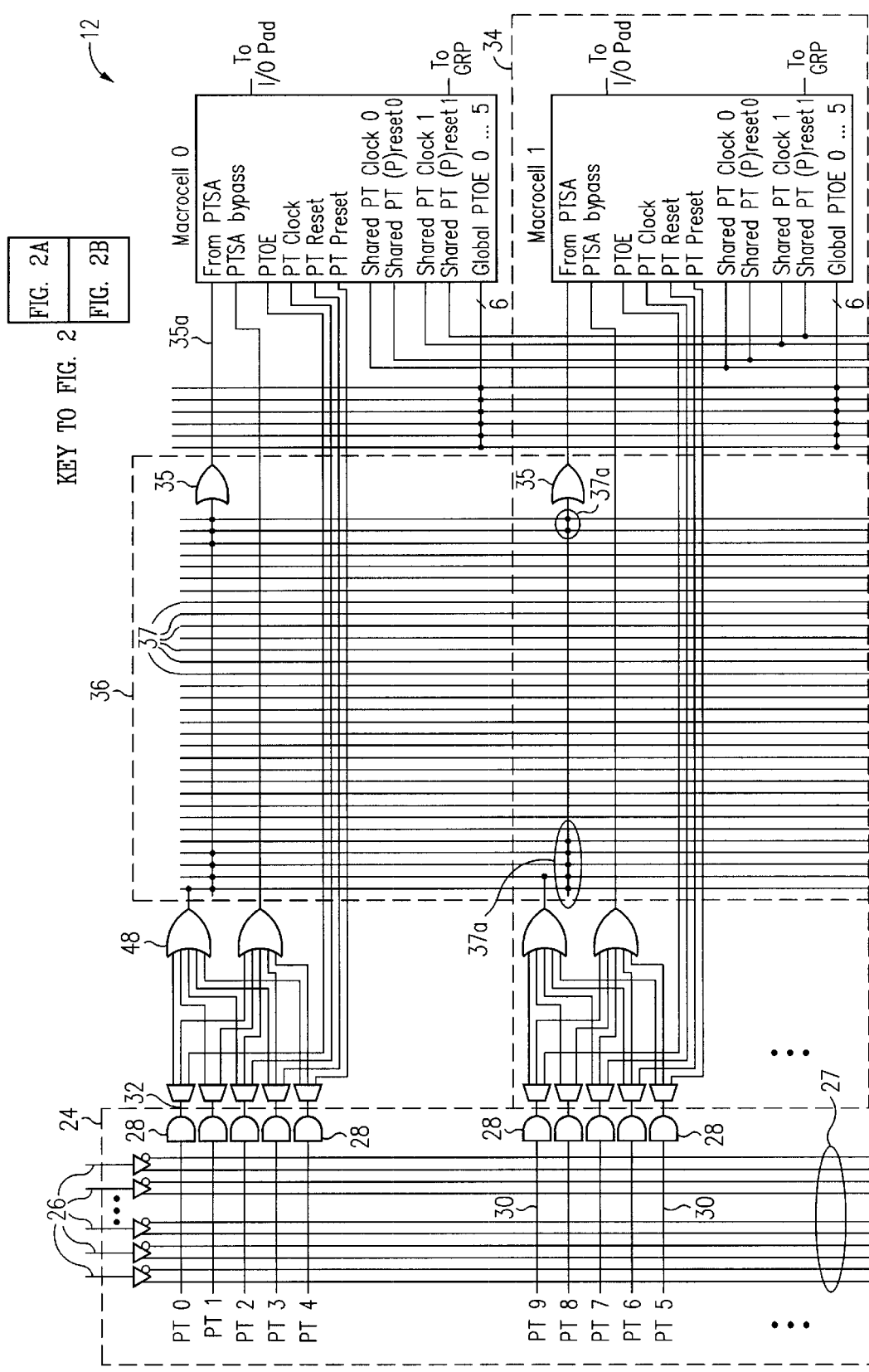
FIGS. 2A and 2B are schematic diagram in partial block form of an exemplary generic logic block in the programmable logic device.
Figure 2B:
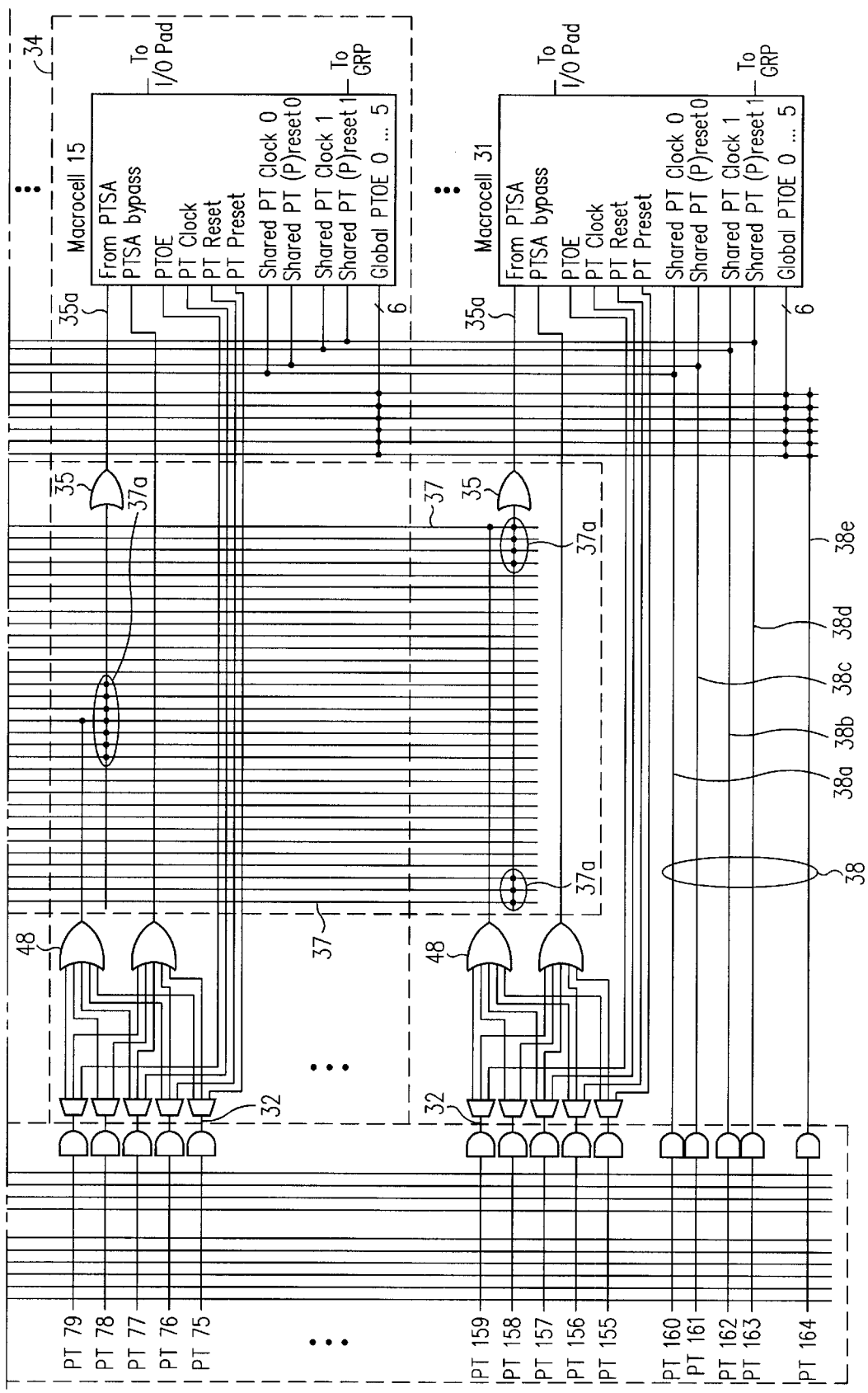

Referring to FIG. 2, a block diagram of an exemplary generic logic block 12 is shown. Generic logic block 12 is, as the name implies, representative of all generic logic blocks 12 in programmable logic device 10.

Generic logic block 12 has an AND array 24 with 165 AND gates 28. AND array 24 receives inputs 26 from an AND array input fuse pattern. The input fuse pattern establishes programmable interconnections between AND array input lines 26 and bus lines 18 in global routing pool 16. The bus lines 18 in global routing pool 16 may be output lines from I/O cells 14 or from other generic logic blocks 12, as previously discussed.

Within AND array 24, the signal on each input line 26 is provided in both inverted and noninverted forms on bus lines 27. Each AND gate 28 has a set of input lines 30 providing input to the AND gate 28. Each input line 30 has a programmable interconnection to each bus line 27 in AND array 24. Thus, AND array 24 is said to be fully populated.

The programmable interconnections in AND array 24, and throughout programmable logic device 10, may be provided by any known programmable interconnect cell. For example, a "Non-Volatile Erasable and Programmable Interconnect Cell" is disclosed in U.S. Pat. No. 5,251,169, issued to Gregg Josephson on May 6, 1991, which is incorporated herein by reference. Such interconnect cells may be part of the previously discussed EEPROM cell array in programmable logic device 10. Alternatively, the programmable interconnections in programmable logic device 10, also known as "fuses," may be SRAM cells, metal fuses, or other known types of programmable interconnections.

AND array 24 produces 165 AND gate outputs, also known as product term outputs 32. AND gates 28 are generally grouped into sets of five AND gates each. Each set of AND gates 28 is assigned to a corresponding macrocell 34. Generic logic block 12 includes 32 macrocells 34. The product term outputs 32 may be shared by macrocells 34 by means of product term sharing array (PTSA) 36, as will be described more fully below. AND array 24 also produces five shared product term outputs 38, which will be described in more detail below.

Macrocell Overview

Figure 3:
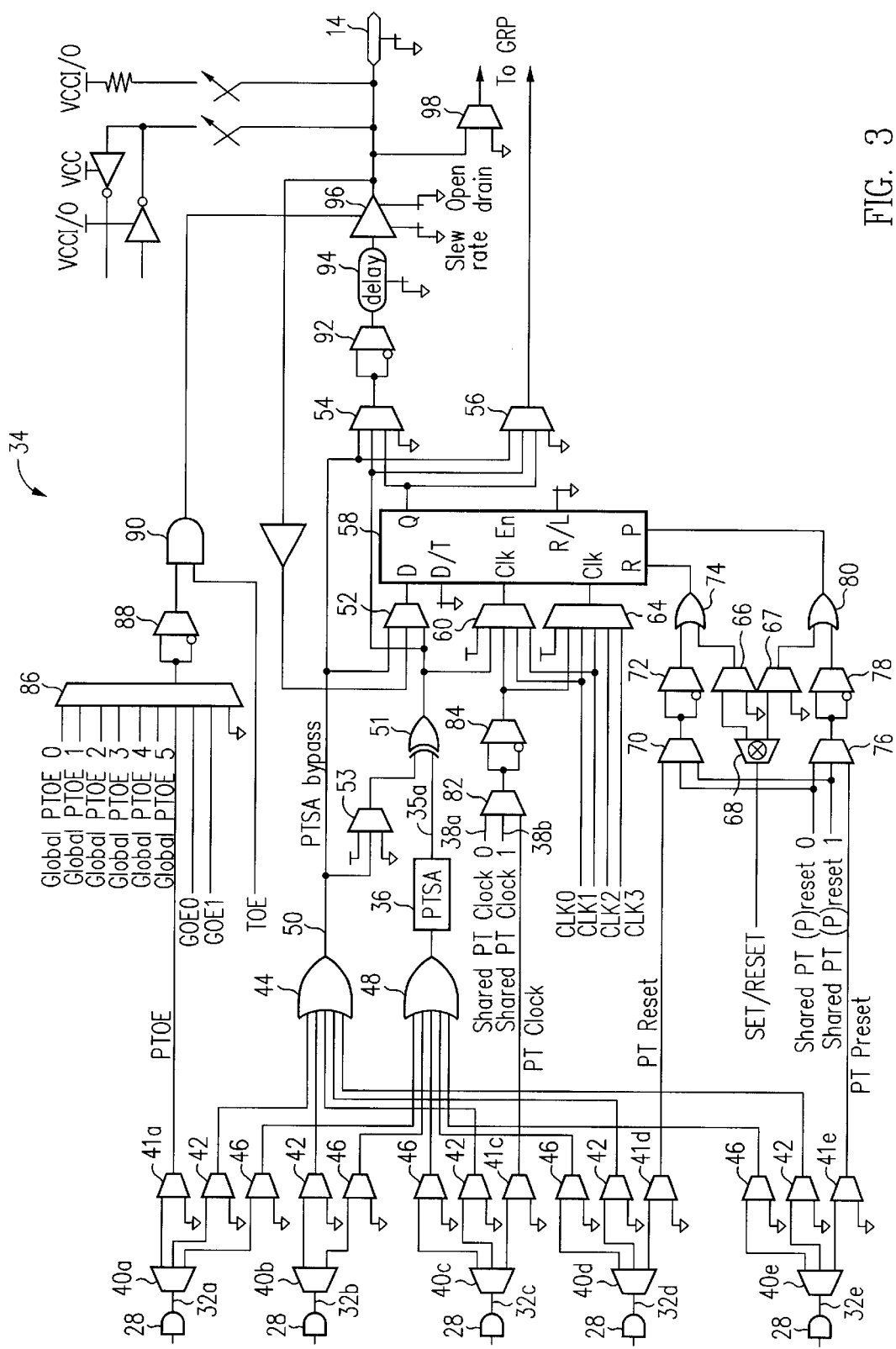
FIG. 3 is a schematic diagram in partial block form of an exemplary macrocell in the programmable logic device.

Referring to FIG. 3, an exemplary macrocell 34 from generic logic block 12 is shown in greater detail. Macrocell 34 receives product term outputs 32a through 32e from the five AND gates 28 assigned to macrocell 34. Each product term output is routed by a demultiplexer 40a through 40e according to a select signal received from one or more EEPROM cells (not shown). One of the outputs from each demultiplexer 40a through 40e is connected, via a multiplexer 42, to the input of a first product term summing OR gate 44. Similarly, a second output from each demultiplexer 40a through 40e is connected, via a multiplexer 46, to the input of a second product term summing OR gate 48. Other alternative outputs from demultiplexers 40a through 40e will be described below.

Thus, any one or more of the product term outputs 32a through 32e may be routed to product term summing OR gate 44 by demultiplexers 40a through 40e. Likewise, any one or more of the product term outputs 32a through 32e may be routed to product term summing OR gate 48 by demultiplexers 40a through 40e.

Demultiplexers 40a through 40e are non-exclusive demultiplexers, meaning that any product term output 32a through 32e may be routed to product term summing OR gate 44, to product term summing OR gate 48, to a multiplexer 41, or to any combination of these destinations. This allows each product term output 32a through 32e to be used for two or more independent functions within macrocell 34, as will be described more fully below.

This non-exclusive routing feature requires a number of EEPROM cells to provide the select signal for each demultiplexer 40a through 40e. The number of EEPROM cells required for each demultiplexer 40a through 40e is equal to the number of outputs of the respective demultiplexer. This is a greater number of EEPROM cells than would be required for an exclusive demultiplexer (e.g. one EEPROM cell for two exclusive demultiplexer outputs). However, as will be described more fully below, the increased flexibility and functionality provided by macrocell 34 may reduce the number of macrocells required to perform a given function, thereby providing an overall reduction in cost to the user of programmable logic device 10.

The product term outputs routed to product term summing OR gate 48 are summed and the output is routed to product term sharing array (PRODUCT TERM SHARING ARRAY 38) 36, where adjacent macrocells may use the output signal, as will be described more fully below. The output of product term summing OR gate 44 is routed on a product term sharing array bypass line 50 to a register data multiplexer 52 and two macrocell output multiplexers 54 and 56.

Macrocell Register

A register 58 receives a data input signal (D) from register data multiplexer 52. Register 58 may be, for example, a rising-edge-triggered D flip-flop or a toggle flip-flop, as will be described more fully below. Register data multiplexer 52 selects the source of the data input signal (D) for register 58 according to a select signal received from one or more EEPROM cells (not shown).

The data input signal (D) may come from product term summing OR gate 44 via PTSA bypass line 50, as previously discussed. Alternatively, the data input signal may come from an XOR gate 51, the function of which will be described below, or from an I/O cell 14. When an I/O cell 14 is selected as the data input signal source, register 58 may be used as an input register for the I/O cell 14. In this mode, macrocell 34 can still produce a logic output signal in addition to the register output signal, as will be described more fully below.

Because any macrocell register 58 in programmable logic device 10 may be used as an input register, the need for additional, dedicated input registers in programmable logic device 10 is reduced or eliminated altogether, thereby reducing the cost of programmable logic device 10. Moreover, the input signal is received at the data input of register 58 directly from I/O cell 14, without using any of the product term inputs or outputs from AND array 24.

Register 58 receives a clock enable signal (Clk En) from a clock enable multiplexer 60. Clock enable multiplexer 60 selects the source of the clock enable signal according to a select signal received from one or more EEPROM cells (not shown). Clock enable multiplexer 60 may select one of two global clock signals (CLK0 and CLK1) as the clock enable signal for register 58. Alternatively, clock enable multiplexer 60 may select a constant HIGH signal ($V_{CC}$) as the clock enable signal for register 58. Other alternatives for the clock enable signal will be described more fully below.

Register 58 receives a clock signal (Clk) from a clock signal multiplexer 64. Clock signal multiplexer 64 selects the source of the clock signal according to a select signal received from one or more EEPROM cells (not shown). Clock signal multiplexer 64 may select one of several global clock signals as the clock signal for register 58. Alternatively, clock signal multiplexer 64 may select a constant HIGH signal ($V_{CC}$). Other alternatives for the clock signal will be described more fully below.

Register 58 receives a reset signal (R) and a preset signal (P) which may be used to clear the register. A global set/reset signal is selectively routed to either a reset multiplexer 66 or a preset multiplexer 67 by an exclusive demultiplexer 68. Demultiplexer 68 selects the destination of the global set/reset signal according to a select signal received from a single EEPROM cell (not shown). Reset multiplexer 66 may select either the reset output of demultiplexer 68 or a LOW signal (ground) for routing to the reset input of register 58, according to a select signal received from one or more EEPROM cells (not shown). Likewise, preset multiplexer 66 may select either the preset output of demultiplexer 68 or a LOW signal (ground) for routing to the preset input of register 58, according to a select signal received from one or more EEPROM cells (not shown).

By routing the global set/reset signal to either the reset input or the preset input of register 58, demultiplexer 68 and multiplexers 66 and 67 allow register 58 to "reset" to a programmable value when a global set/reset signal is received, such as when programmable logic device 10 is initially powered up. Thus, a user may program an initial state for all registers 58 in programmable logic device 10, or for some subset of the registers, using three EEPROM cells per register. This is an advantage over previous programmable logic devices, in which a global reset signal would typically reset (zero) all registers in the device.

Figure 4:
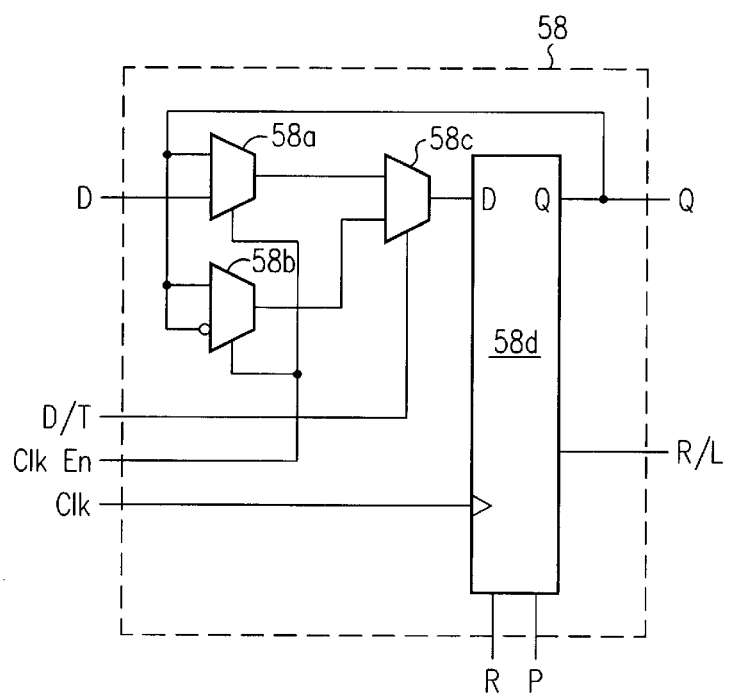
FIG. 4 is a more detailed schematic diagram of a register for use in the exemplary macrocell.

Referring to FIG. 4, a more detailed schematic diagram of one embodiment of register 58 is shown. Register 58 includes a D flip-flop 58d, which recevies a data input (D') and a clock input (Clk) and generates an output (Q'). A data multiplexer 58c selects the source of the data input to flip-flop 58d according to a select signal (D/T). The select signal (D/T) determines whether register 58 will operate as a D flip-flop or a toggle flip-flop.

Thus, if the D/T signal is LOW, then the output of a multiplexer 58a is selected as the data input of flip-flop 58d. Multiplexer 58a selects either the register data input (D) or the flip-flop output signal (Q') as an output, according to the register clock enable signal from clock enable multiplexer 60. Thus, if the clock enable signal is HIGH, the register data input (D) is selected as the data input (D') for flip-flop 58d, enabling flip-flop 58d to act as a D flip-flop. If the clock enable signal is LOW, the flip-flop output signal (Q') is selected as the data input (D') for flip-flop 58d, causing flip-flop 58d to hold its present output.

If the D/T signal is HIGH, then the output of a programmable inverter 58b is selected as the data input (D') of flip-flop 58d. Programmable inverter 58b selects either the uninverted flip-flop output signal (Q') or the inverted flip-flop output signal (Q'-bar) as an output, according to the register clock enable signal from clock enable multiplexer 60. Thus, if the clock enable signal is LOW, the uninverted flip-flop output signal (Q') is selected as the data input (D') for flip-flop 58d, while if the clock enable signal is HIGH, the inverted flip-flop output signal (Q'-bar) is selected. As a result, register 58 acts as a toggle flip-flop, with output (Q) changing state every time the clock enable signal from clock enable multiplexer 60 changes state. The register data input signal (D) has no effect on the operation of register 58 in this mode.

Either one of the foregoing modes may be selected according to the particular functions to be performed by macrocell 34. Alternatively, other configurations of register 58 may be selected for particular applications, and will be understood to be within the scope of the present invention.

Macrocell Input and Register Control

Referring again to FIG. 3, demultiplexers 40a through 40e, together with multiplexers 42 and 46, allow each product term output 32a through 32d from AND array 24 to be used within macrocell 34 as a product term input to product term summing OR gate 44, as a product term input to product term summing OR gate 48, or as a control signal for macrocell 34, or any combination of the above.

Thus, for example, product term outputs 32d and 32e may be used as reset and preset inputs, respectively, for register 58. If demultiplexer 40d and multiplexer 41d are programmed to use product term output 32d as a reset signal, then product term output 32d is routed to a reset multiplexer 70. Reset multiplexer 70 selects either the output from multiplexer 41d or one of two shared product term outputs as a reset input for register 58, according to a select signal received from one or more EEPROM cells (not shown). The output of reset multiplexer 70 is selectively inverted by programmable inverter 72 according to a signal received from one or more EEPROM cells (not shown).

The output of programmable inverter 72 is received at an input of a reset OR gate 74. Reset OR gate 74 ORs the selected reset signal with the reset output from global set/reset demultiplexer 68. The output from reset OR gate 74 is provided to the reset input (R) of register 58. Thus, either product term output 32d or the global set/reset signal will be used to reset register 58.

Likewise, if demultiplexer 40e is programmed to use product term output 32e as a preset signal, then product term output 32e is routed to a preset multiplexer 76. Preset multiplexer 76 selects either the output from multiplexer 41e or one of two shared product term outputs as a preset input for register 58, according to a select signal received from one or more EEPROM cells (not shown). The output of preset multiplexer 37 is selectively inverted by programmable inverter 78 according to a signal received from one or more EEPROM cells (not shown).

The output of programmable inverter 78 is received at an input of a preset OR gate 80. Preset OR gate 80 ORs the selected preset signal with the preset output from global set/reset demultiplexer 68. The output from preset OR gate 80 is provided to the preset input (P) of register 58. Thus, either product term output 32e or the global set/reset signal may be used to reset register 58.

Demultiplexer 40c may be programmed to use product term output 32c from AND array 24 as a clock signal or clock enable signal for register 58. This is useful when a clock signal or clock enable signal resulting from a logic operation, rather than a standard clock signal or clock enable signal, is required. Thus, demultiplexer 40c and multiplexer 41c may be programmed to route product term output 32c to a multiplexer 82. Multiplexer 82 selects the output of multiplexer 41c or one of two shared product term outputs as an output signal according to a select signal received from one or more EEPROM cells (not shown). The output of multiplexer 82 is selectively inverted by a programmable inverter 84 according to a select signal received from one or more EEPROM cells (not shown). The output of programmable inverter 84 is provided to clock enable multiplexer 60 and clock signal multiplexer 64. Thus, using multiplexers 60 and 64, product term output 32c can be programmed to be either the clock enable signal or the clock signal for register 58.

Demultiplexer 40a may be programmed to use product term output 32a from AND array 24 as an output enable signal for macrocell 34. Thus, demultiplexer 40a and multiplexer 41a may be programmed to route product term output 32a to an output enable multiplexer 86. Output enable multiplexer 86 selects the output of multiplexer 41a or one of six global output enable signals as an output signal according to a select signal received from one or more EEPROM cells (not shown). The output of multiplexer 88 is selectively inverted by a programmable inverter 88 according to a select signal received from one or more EEPROM cells (not shown). The output of programmable inverter 88 is provided to an input of an AND gate 90. AND gate 90 also receives a global test output enable (TOE) signal as an input. During normal operation, the TOE signal is always HIGH, allowing the output enable signal selected by multiplexer 86 to act as an output enable signal. However, programmable logic device 10 may be tested by making the TOE signal LOW, thereby "tristating" (floating) all output signals from macrocells 34.

Product term output 32b, unlike the other product term outputs, may not be used as a control signal for register 58. Thus, product term output 32b may only be routed to product term summing OR gates 44 and 48.

Macrocell Output

The output (Q) of register 58 is routed to macrocell output multiplexers 54 and 56. Macrocell output multiplexer 56 provides an output signal to global routing pool 16, where the signal may be programmably routed to another generic logic block 12 in programmable logic device 10. The output signal from macrocell output multiplexer 56 may be selected from the register output (Q), PTSA bypass line 50, XOR gate 51 or ground. Macrocell output multiplexer 56 selects the output signal according to a select signal received from one or more EEPROM cells (not shown).

Likewise, the output signal from macrocell output multiplexer 54 may be selected from the register output (Q), PTSA bypass line 50, XOR gate 51 or ground. Macrocell output multiplexer 54 selects the output signal according to a select signal received from one or more EEPROM cells (not shown). Macrocell output multiplexer 54 provides an output signal to a programmable inverter 92, which selectively inverts the signal according to a select signal received from one or more EEPROM cells (not shown). The output of programmable inverter 92 is provided to a programmable delay element 94, which selectively delays the signal according to a signal received from one or more EEPROM cells (not shown).

Programmable delay element 92 provides a programmable delay for output signals en route to I/O cells 14. This can be useful when several output signals are being provided simultaneously to several respective I/O cells 14. Output bus lines external to programmable logic device 10 may be connected to the respective I/O cells. These output bus lines may be powered by a single power supply with a limited peak current capacity. Thus, the simultaneous fast switching of several output signals may exceed the peak current capacity of the power supply, resulting in slow switching on all bus lines. In addition, simultaneous switching of several output signals may create noise in the output signals due to ground bounce and other phenomena in the power supply.

Some of the output signals may be more time-critical than other output signals. In other words, fast and timely signal transitions are more important for some output signals than for others. Thus, some or all macrocells 34 are provided with a programmable delay element 94. The programmable delay elements 94 selectively delay those macrocell output signals which are not time-critical, allowing fast switching of the limited number of time-critical macrocell output signals. Thus, programmable delay element 94 preferably delays the output signal of programmable inverter 92 by approximately 0.5 nanoseconds when programmed to do so.

Figure 5:
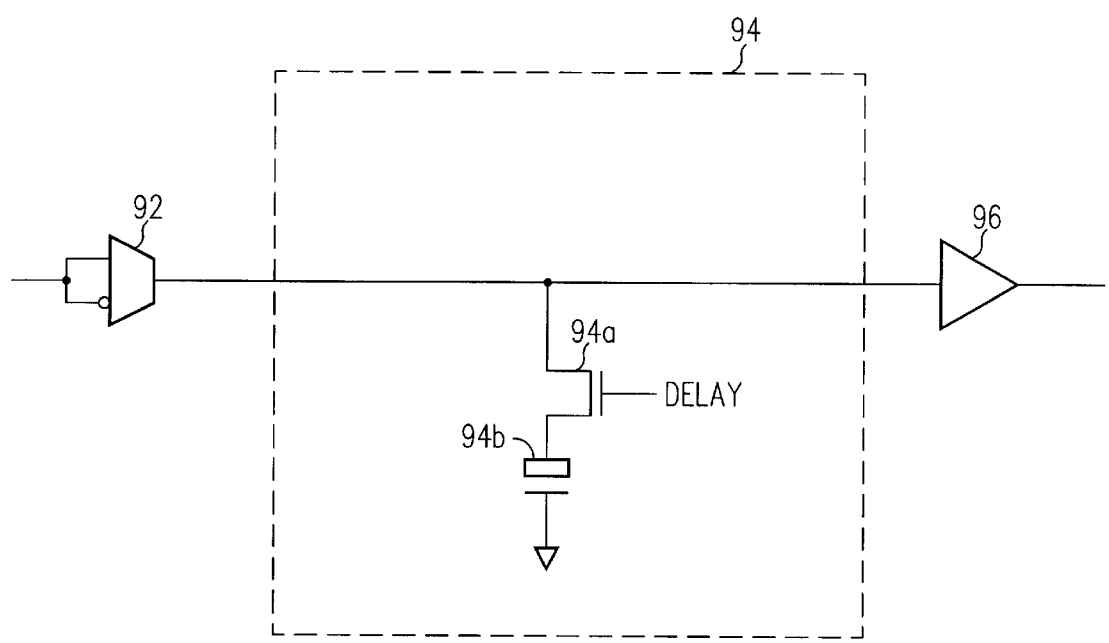
FIG. 5 is a schematic diagram of an exemplary programmable delay element for use in the programmable logic device.

Referring to FIG. 5, a schematic diagram of an exemplary programmable delay element 94 is shown. A delay control signal is received at the gate of an n-channel field effect transistor (FET) 94a. The delay control signal may come from, for example, an EEPROM cell (not shown).

If the delay control signal is LOW, FET 94a will not conduct from drain to source, leaving the conduction line from programmable inverter 92 to programmable driver 96 essentially unaffected by programmable delay element 94. If the delay control signal is HIGH, FET 94a will conduct from drain to source, allowing the output signal to pass through FET 94a. FET 94a has a gate-channel capacitance that introduces a delay in the output signal from programmable inverter 92 as it passes through programmable delay element 94. Specifically, the gate-channel capacitance of FET 94a causes a delay in the transition of the output signal from LOW to HIGH or vice versa.

Because the gate-channel capacitance varies with gate-source voltage, particularly near the threshold voltage of FET 94a, the delay introduced into the output signal transition will be different for HIGH-to-LOW transitions than for LOW-to-HIGH transitions. To compensate for this asymmetry, a p-type capacitor 94b is connected to the source of FET 94a. Thus, when the delay control signal is HIGH, both FET 94a and capacitor 94b add a capacitive load to the signal conduction path. Programmable delay element 94 therefore introduces a symmetrical delay of approximately 0.5 nanoseconds into the output signal from programmable inverter 92. Other configurations for programmable delay element 94, such as a chain of inverters, may be implemented which produce similar delay characteristics without departing from the spirit and scope of the invention.

Returning to FIG. 4, the output of programmable delay element 94 is provided to a programmable driver 96. Programmable driver 96 receives the output enable signal from AND gate 90. If the output of AND gate 90 is HIGH, programmable driver 96 drives the output signal from programmable delay element 94 to an I/O cell 14. If the output of AND gate 90 is LOW, programmable driver 96 leaves I/O cell 14 tristated, or floating. This latter state is useful when an input signal is to be received from I/O cell 14. The input signal is unaffected by programmable driver 96, and is received by an input multiplexer 98 for routing to global routing pool 16. Programmable driver 96 may also include a slew rate control and a passive pull-up option to increase the suitability of programmable logic device 10 to a variety of output needs.

Macrocell output multiplexers 54 and 56 receive select signals from two separate sets of EEPROM cells. Thus, macrocell output multiplexers 54 and 56 may independently select the sources of their respective output signals. This is an improvement over previous programmable logic devices, in which only a single macrocell output signal was typically available.

It should be noted that the number of macrocells 34 may exceed the number of I/O cells 14, in which case not every macrocell 34 will provide an output signal to an I/O cell. Thus, referring to FIG. 3, the output of programmable driver 96 may not be connected to an I/O cell 14. Indeed, output multiplexer 54, programmable inverter 92, programmable delay element 94 and programmable driver 96 are superfluous components that need not be included in any macrocell 34 that will not provide an output signal to an I/O cell 14.

Product Term Sharing Array

As previously described, each macrocell 34 has five dedicated product term outputs 32a through 32e from AND array 24. These dedicated product term outputs are available to the macrocell 34 by means of product term sharing array bypass line 50 regardless of the state of product term sharing array 36. However, to enhance the capability and flexibility of programmable logic device 10, product terms may be shared among macrocells by means of product term sharing array 36.

Referring to FIG. 2, product term sharing array 36 includes a set of bus lines 37. The number of bus lines 37 is equal to the number of macrocells 34, for reasons which will become apparent. Thus, in this example, product term sharing array 36 includes 32 bus lines.

In each macrocell 34, a set of five product term outputs 32a through 32e is coupled to a product term summing OR gate 48 as previously described. Each product term summing OR gate 48 has an output connected to a respective one of the bus lines 37. Thus, each bus line 37 in product term sharing array 36 carries an output signal from a respective one of the product term summing OR gates 48.

Product term sharing array 36 also includes 32 output OR gates 35. Each output OR gate 35 produces an output signal on an output line 35a, which is connected to an input of XOR gate 51, as shown in FIG. 3.

Each output OR gate 35 receives input signals from selected bus lines 37. A set of programmable interconnections 37a determines which bus lines 37 provide input to each output OR gate 35. Programmable interconnections 37a may be any known type of programmable interconnect cell. Programmable interconnections 37a are available to connect each output OR gate 35 to the product term summing OR gate 48 dedicated to that macrocell 34, as well as product term summing OR gates from adjacent macrocells.

In this example, each output OR gate 35 may be connected to as many as six product term summing OR gates 48 in addition to its own dedicated product term summing OR gate 48. The available product term summing OR gates 48 include the three product term summing OR gates 48 immediately "above" the macrocell and the three product term summing OR gates 48 immediately "below" the macrocell. Thus, each output OR gate 35 may be connected to its own dedicated product term summing OR gate 48 and six adjacent product term summing OR gates.

For the output OR gate 35 located at the top of product term sharing array 36, it will be apparent that there are no product term summing OR gates 48 located "above" the output OR gate 35. Thus, in an asymmetrical product term sharing arrangement, the output OR gate 35 located at the top of product term sharing array 36 would have only four product term summing OR gate 48 outputs available to it: the product term summing OR gate 48 dedicated to that macrocell and the three product term summing OR gates 48 immediately "below" the macrocell. This is in contrast to the output OR gates 35 located near the center of product term sharing array 36, which would each have seven product term summing OR gate 48 outputs available to it.

Likewise, the output OR gate 35 located at the bottom of product term sharing array 36 would have only four product term summing OR gate 48 outputs available to it in an asymmetrical arrangement. This difference in the number of available paths to each output OR gate 35 would create restrictions in the routing of product terms through product term sharing array 36, making programmable logic device 10 less flexible and more cumbersome to program.

However, as illustrated by programmable interconnections 37a in FIG. 2, the output OR gate 35 located at the top of product term sharing array 36 may be connected to the three bottom-most product term summing OR gates 48 as well as the three product term summing OR gates 48 immediately "below" the output OR gate 35. Likewise, the bottommost output OR gate 35 in product term sharing array 36 may be connected to the three topmost product term summing OR gates 48 as well as the three product term summing OR gates 48 located immediately "above" the output OR gate 35. As is shown in FIG. 2, similar arrangements are made for the other output OR gates 35 near the top and bottom of product term sharing array 36.

Thus, product term sharing array 36 is said to have "wraparound" or circular symmetry. Each output OR gate 35 has programmable interconnections to seven bus lines 37, and each product term summing OR gate 48 output is made available to seven output OR gates 35, regardless of location within product term sharing array 36.

This is an improvement over previous programmable logic devices, in which product term sharing became asymmetric near the ends of the product term sharing array, thereby placing limitations on routing within the programmable logic device and creating an uneven distribution of product term sharing. Moreover, the symmetrical product term sharing of the present invention is accomplished with only one additional OR gate (output OR gate 35) per output line from product term sharing array 36. Thus, product term sharing array 36 may be expanded in size without significantly increasing the signal delays created by product term sharing array 36.

It should be noted that the number of available connections for each output OR gate 35 could be any number from two to the total number of product term summing OR gates 48, which in this example is 32. In the case of 32 available connections for each output OR gate 35, the output of every product term summing OR gate 48 is made available to each output OR gate 35. This arrangement, referred to as "fully populated," may be feasible for smaller generic logic blocks with fewer product term inputs and fewer product term sharing array outputs. However, with 32 product term sharing array outputs, such an arrangement would be prohibitively large and slow. Thus, a more limited, but still symmetrical, arrangement is preferred in this example.

In accordance with the foregoing, each output OR gate 35 receives output signals from up to seven product term summing OR gates 48. These signals are ORed together at output OR gate 35. Referring to FIG. 3, the output of output OR gate 35 is received by XOR gate 51. If XOR multiplexer 53 is programmed to select ground as its output, then the output from output OR gate 35 is passed through XOR gate 51 to register data multiplexer 52, where the signal may be selected as the data input signal (D) for register 58. Alternatively, if XOR multiplexer 53 is programmed to select a HIGH signal as its output, then the output from output OR gate 35 is inverted by XOR gate 51 and passed to register data multiplexer 52. If XOR multiplexer 53 is programmed to select PTSA bypass line 50 as its output, then the signal on PTSA bypass line 50 is combined in an exclusive OR operation with the output signal from output OR gate 35 in product term sharing array 36. The resulting output signal is provided to register data multiplexer 52, where the signal may be selected as the data input signal (D) for register 58, and is also provided to macrocell output multiplexers 54 and 56 as previously described. The output signal from XOR gate 51 is also provided to clock enable multiplexer 60, where the signal may be selected as the clock enable signal for register 58.

While product term sharing array 36 has been described herein as receiving product term outputs from AND array 24, product term sharing array 36 may be used to share output values derived from any kind of logic array. Thus, the phrase "product term," as used herein, may be any type of logic output signal.

Furthermore, while product term sharing array 36 is described as allowing product term sharing primarily among adjacent macrocells, product term sharing array 36 may be configured to allow product term sharing according to any desired pattern. For example, product term sharing array 36 could be configured to allow each output OR gate 35 to receive signals from every third or fourth product term summing OR gate 48. The selected product term sharing pattern may or may not involve an even distribution of shared product terms throughout product term sharing array 36, as described above.

Shared Product Terms

In a generic logic block 12 of programmable logic device 10, it may be desirable for some or all of the macrocells 34 within the generic logic block to use clock, clock enable, set/reset or output enable signals that result from a logic operation. Furthermore, it may be desirable for some or all of the macrocells 34 to use common or shared signals that result from a logic operation. This could be accomplished by means of the previously described control methods using the product term outputs dedicated to each macrocell, and by duplicating within AND array 24 the logic operation that produces the desired control signal. However, this method would result in unnecessary waste of product terms and other resources in the respective macrocells. This method may also result in significant signal skew between the control signals for the respective macrocells, which would be unacceptable, for example, for a common clock signal.

To solve this problem, shared product term outputs 38 from AND array 24 are provided to each macrocell 34, as shown in FIG. 2. Shared product term outputs 38 are independent of the other product term outputs provided to macrocells 34. In this example, shared product terms outputs 38 include two shared product term clock lines 38a and 38b, two shared product term set/reset lines 38c and 38d, and one shared product term output enable line 38e.

Referring to FIG. 3, shared product term clock lines 38a and 38b are provided to multiplexer 82 of each macrocell 34, where they may be routed to clock enable multiplexer 60 and clock signal multiplexer 64. If one of these multiplexers is programmed to select shared product term output 38a or 38b, then shared product term output 38a or 38b may be used as either the clock enable signal or the clock signal for register 58 in the macrocell 34.

Alternatively, clock enable multiplexer 60 or clock signal multiplexer 64 for any given macrocell 34 may be programmed to utilize product term output 32c as a product term clock signal or clock enable signal for that macrocell. Thus, each macrocell 34 may utilize either an individualized product term clock signal (product term output 32c) or a shared product term clock signal (shared product term output 38a or 38b). This is an improvement over previous programmable logic devices, in which the choice between a shared product term clock signal and an individualized product term clock signal was not available.

Similarly, shared product term set/reset lines 38c and 38d are provided to reset multiplexer 70 and preset multiplexer 76 of each macrocell 34, where they may be routed to the reset and preset inputs, respectively, of register 58. Shared product term output enable line 38e is provided (with some redundancy) to output enable multiplexer 86, where it may be routed as an output enable signal to programmable driver 96.

Macrocell Flexibility

As described above, each macrocell 34 has two independent product term summing OR gates 44 and 48, as well as two independent output multiplexers 54 and 56. Each product term summing OR gate 44 or 48 may use any one or more of the five product term outputs 32a through 32e dedicated to that macrocell. Furthermore, each product term summing OR gate 44 or 48 may have its signal routed to either output multiplexer 54 or 56. Thus, each macrocell 34 is capable of simultaneous performing two discrete functions.

Figure 6:
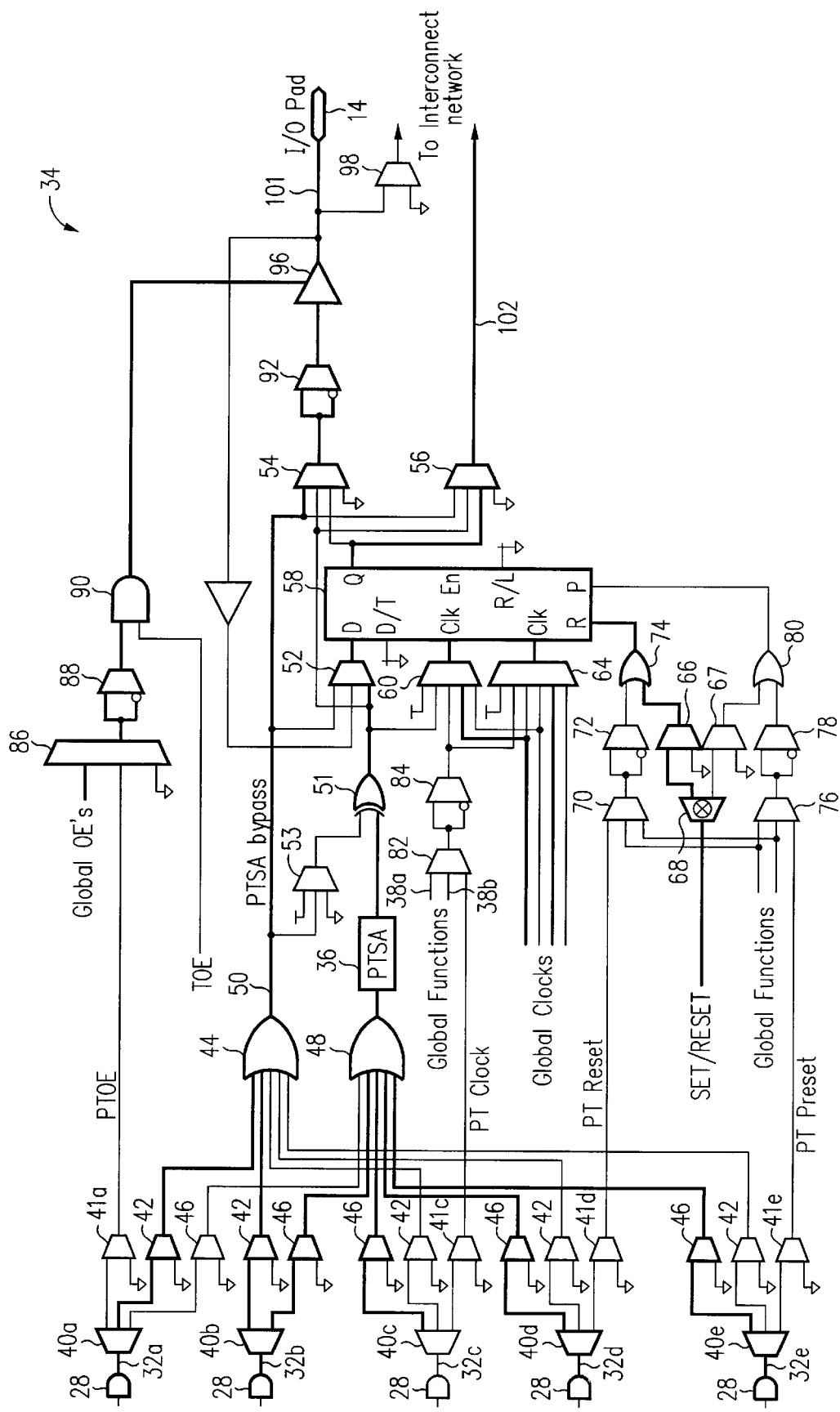
FIG. 6 is a schematic diagram of the exemplary macrocell with signal paths highlighted.

This property is illustrated in FIG. 6, in which a macrocell 34 is shown with two independent signal paths 101 and 102 highlighted. On path 101, product term outputs 32a and 32b are routed to product term summing OR gate 44. The output of product term summing OR gate 44 is routed on product term sharing array bypass line 50, through output multiplexer 54, through programmable inverter 92, and through programmable driver 96 to I/O cell 14.

On path 102, product term outputs 32b, 32c, 32d and 32e are routed to product term summing OR gate 48. The output of product term summing OR gate 48 passes through product term sharing array 36, where it may be summed with product terms from other macrocells as previously described. The output of product term sharing array 36 is routed through XOR gate 51 and register data multiplexer 52 to be stored by register 58. The output (Q) of register 58 is routed through output multiplexer 56 to global routing pool 16.

Thus, macrocell 34 simultaneously performs the following operations:

$$\text{Output 1}=PT(A)\oplus PT(B) \tag{2}$$

$$\text{Output 2}=PT(B)\oplus PT(C)\oplus PT(D)\oplus PT(E) \tag{3}$$

This increased macrocell functionality requires additional EEPROM cells to control demultiplexers 40a through 40e as previously described, as well as an additional product term summing OR gate for each macrocell, than would be required for a single-function macrocell. However, this increased component cost of each macrocell may be justified by doubling the functionality of even a few macrocells 34.

The increased functionality of macrocells 34 also makes the programming of programmable logic device 10 easier. In assigning functions to various macrocells 34 in programmable logic device 10, one consideration is the limited number of communication paths provided among macrocells 34 by global routing pool 16. As previously discussed, creating a fully populated global routing pool would make global routing pool 16 prohibitively expensive and slow. Thus, not all macrocell outputs have available routing to all macrocell inputs. Likewise, communication paths do not exist between all I/O cells 14 and all macrocells 12.

Accordingly, in programmable logic device 10 and other programmable logic devices, some macrocell function assignment plans which would otherwise be feasible for the programmable logic device are infeasible due to the lack of available routing among macrocells and I/O cells to accomplish the desired functions. This situation can resolved by "swapping," in which function assignments for two selected macrocells are exchanged in an attempt to find a feasible function assignment plan that has the necessary routing available.

In a programmable logic device with single-function macrocells, if all or nearly all macrocells are assigned a function, swapping is an inefficient way to locate a feasible function assignment plan, since each swap may create a new routing problem. Indeed, if the programmable logic device is at or near capacity, there may be no feasible function assignment plan. Thus, a macrocell "vacancy" rate of up to 20% or more may be preferred in order to generate a feasible function assignment plan for programming the device.

In programmable logic device 10, if each macrocell 34 is assigned a single function, macrocell "vacancies" may still exist, since each macrocell 34 may perform two discrete functions. In particular, a function may be swapped into a macrocell without swapping out the existing macrocell function if (a) the two functions together use a total of five or fewer product terms, or (b) the two functions have one or more product terms in common, so that the number of unique product terms required to perform the two functions is less than or equal to five.

Of course, there are some limitations on the combining of functions within a macrocell 34. For example, if two functions each require the use of a register 58 to store the output signal, then the two functions may not be performed in a single macrocell 34. Likewise, if two functions each require the introduction of product terms from adjacent macrocells via product term sharing array 36, the two functions may not be performed in a single macrocell 34.

However, many times it is possible to combine two functions in a single macrocell 34. This is particularly true when the mean number of product terms required for each function in programmable logic device 10 is LOW. For example, if a set of functions is to be performed by programmable logic device 10 in which the average number of product terms required per function is 2.5 or less, then the number of functions which may be performed by programmable logic device 10 may be close to two times the number of macrocells 34 in programmable logic device 10.

Although the present invention and its advantages have been described in detail, it should be understood that various changes, substitutions, and alterations can be made therein without departing from the spirit and scope of the invention as defined by the appended claims.

We claim:

1. A method for minimizing instantaneous currents in a bus of signals driven by a plurality of signal buffers, comprising:

providing a programmable delay element in each of said signal buffers, said programmable delay element of each signal buffer being selectably enabled to include a predetermined time delay to the time elapsed between the switching of an input signal provided to said signal buffer and the switching of an output signal generated at an output terminal of said signal buffer; and in a selected group of said signal buffers, programming said delay elements of said signal buffers to include said predetermined time delay; and providing synchronized input signals to the signal buffers of said bus, so that said selected group of signal buffers each generate an output signal switching after said predetermined delay relative to the switching of output signals generated by others of said signal buffers.

2. A method as in claim 1, wherein said delay element is provided by an MOS capacitor.

3. A method as in claim 1, wherein programming of each delay element is accomplished by setting a bit in an electrically erasable programmable read-only memory element.

4. A method for minimizing instantaneous currents in a bus, comprising:

receiving a first plurality of signals at a corresponding first plurality of signal buffers;

receiving a second plurality of signals at a corresponding second plurality of signal buffers, the second plurality of signals switching in synchronization with the first plurality of signals, each of the second plurality of signal buffers having a programmable delay element;

providing the first plurality of signals to a corresponding first plurality of bus conductors by the first plurality of signal buffers;

delaying the second plurality of signals for a predetermined time interval by the programmable delay elements of the second plurality of signal buffers; and providing the second plurality of signals, delayed by the predetermined time interval, to a corresponding second plurality of bus conductors by the second plurality of signal buffers so as to prevent simultaneous switching of the first and second plurality of signals on the bus.

5. The method of claim 4, further comprising programming the programmable delay elements in the second plurality of signal buffers to delay the second plurality of signals for the predetermined time interval.

6. The method of claim 5, further comprising:

providing a programmable delay element in each one of the first plurality of signal buffers; and programming the programmable delay elements in the first plurality of signal buffers so as not to delay the first plurality of signals for the predetermined time interval.

7. The method of claim 6, wherein programming each delay element comprises setting a bit in an electrically erasable programmable read-only memory element.

* * * * *